(12) United States Patent
Nelson et al.

(10) Patent No.: US 6,504,437 B1
(45) Date of Patent: Jan. 7, 2003

(54) LOW-NOISE, FAST-LOCK PHASE-LOCK LOOP WITH "GEARSHIFTING" CONTROL

(75) Inventors: Dale H. Nelson, Macungie, PA (US); Lizhong Sun, Budd Lake, NJ (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/891,595

(22) Filed: Jun. 26, 2001

(51) Int. Cl.[7] .................................................. H03L 7/00
(52) U.S. Cl. ............................... 331/14; 331/16; 331/17
(58) Field of Search .............................. 331/14, 15, 16, 331/17, 25, 1 A; 327/156, 157, 147, 148

(56) References Cited

U.S. PATENT DOCUMENTS

| | | | |
|---|---|---|---|
| 5,146,187 A | * 9/1992 | Vandegraaf | 331/17 |
| 5,420,545 A | * 5/1995 | Davis et al. | 331/17 |
| 5,675,292 A | * 10/1997 | McCune, Jr. | 331/17 |
| 5,802,450 A | * 9/1998 | Horton | 331/17 |
| 5,920,233 A | 7/1999 | Denny | 331/14 |
| 5,942,949 A | * 8/1999 | Wilson et al. | 331/17 |
| 6,044,124 A | 3/2000 | Monahan et al. | 375/376 |
| 6,141,394 A | 10/2000 | Linebarger et al. | 375/376 |
| 6,147,561 A | 11/2000 | Rhee et al. | 331/12 |

OTHER PUBLICATIONS

F. Gardner, *Phaselock Techniques*, 1979, p. 89.
T. Riley, M. Copeland and T. Kwasniewski, "Delta–Sigma Modulation in Fractional–N Frequency Synthesis,"*IEEE Journal of Solid–State Circuits*, May 1993, pp. 553–559.
L. Sun, T. Lepley, F. Nozahic, A. Bellissant, T. Kwasniewski and B. Heim, "Reduced Complexity, High Performance Digital Delta–Sigma Modulator for Fractional–N Frequency Synthesis," *IEEE Journal of Solid–State Circuits*, 1999, pp. II–152–II–155.

* cited by examiner

*Primary Examiner*—Tuan T. Lam
(74) *Attorney, Agent, or Firm*—Duane Morris LLP; Joseph F. Oriti

(57) ABSTRACT

A phase-lock loop (PLL) circuit provides fast locking and low spurious modulation jitter through "gearshifting" control. The gearshifting PLL combines the advantages of low jitter from integer-N PLL and fast locking from fractional-N PLL. The PLL circuit includes a phase/frequency detector, a charge pump, a loop filter, and a voltage controlled oscillator (VCO). Control of the PLL circuit includes configuring the PLL circuit in two configurations, one for each phase of operation. The bandwidth of the loop filter is increased during the first phase of operation and the circuit is locked to a frequency that is close to the desired output frequency. During the second phase, the bandwidth of the loop filter is decreased and the circuit is locked to the desired frequency. The first configuration provides a relatively fast lock time compared to the lock time provided by the second configuration. The second configuration provides more stability than the first configuration.

15 Claims, 5 Drawing Sheets

US 6,504,437 B1

LOW-NOISE, FAST-LOCK PHASE-LOCK LOOP WITH "GEARSHIFTING" CONTROL

FIELD OF THE INVENTION

The present invention relates to phase-lock loops and specifically a fast locking phase-lock loop having fine output resolution, low jitter noise and "gearshift" control.

BACKGROUND

A phase-lock loop (PLL) is a circuit that generates a periodic output signal having a constant phase relationship with respect to a periodic input signal. PLLs are widely used in many types of measurement, microprocessor, and communication applications. Phase locked loop (PLL) designers often have a major challenge with regard to the simultaneous achievement of fine output resolution (narrow channel spacing), fast lock time, and low jitter. This can be particularly difficult because the low loop bandwidth needed to reduce jitter and improve loop stability phase margin increases PLL locking time.

Typically, in PLL circuits, the frequency of the input signal differs from the desired frequency of the PLL output signal. Thus, frequency division circuitry is implemented in PLL circuits to compensate for this difference. Two types of commonly implemented division circuits are integer-N and fractional-N divider circuits. In an integer-N divider, a denominator N is variable in integer steps. The smallest step change in the frequency of the output signal provided by an integer-N PLL (comprising an integer-N divider circuit) is equal to the frequency of the signal provided to the input of the PLL. Thus, output signal resolution of a PLL circuit is limited to the frequency of the PLL input signal. In order to produce smaller step changes in the output frequency, circuits known as fractional-N divider circuits have been devised. Fractional-N divider circuits typically switch the divide ratio of the divider between two different values on successive comparison cycles of the phase detector to obtain an average denominator value between the two values. It is well known in the art that by dividing by a value, n, sometimes and n+1 at other times, the average denominator value is N, where n<N<n+1. For example, a divide ratio of 200.5 can be achieved by alternately switching the denominator between 200 and 201. Fraction-N PLL circuitry is described in a paper titled, "Delta-Sigma Modulation In Fraction –N Frequency Synthesis," authored by T. A. D. Riley, M. A. Copeland, and T. A. Kwasniewski, published in the IEEE Journal of Solid State Circuits, volume 28, no. 5, May 1993, pages 553–559, which is incorporated by reference herein, in its entirety.

Fractional-N PLLs provide relatively fast lock times. However, as the denominator (divider) switches between different division ratios, unwanted sidebands are introduced in the output spectrum of the frequency of the PLL output signal. These unwanted sidebands are referred to a phase noise or jitter. To avoid degradation of the PLL circuit performance due to jitter, a more complex loop filter having a narrow bandwidth may be implemented. However, a more complex loop filter contributes to slower lock times. This can result in less than optimal tracking or signal lock. Thus, a need exists for a PLL circuit and a technique for controlling a PLL circuit, which provide the loop stability and low jitter associated with an integer-N PLL and also provide the fine output resolution and fast lock times associated fractional-N PLL.

SUMMARY OF THE INVENTION

A method for controlling a phase-lock loop (PLL) circuit includes configuring the PLL circuit in two configurations. The first configuration provides a relatively fast lock time compared to lock times provided by the second configuration. The second configuration provides more stability than the first configuration.

In another embodiment of the invention, a phase-lock loop (PLL) circuit includes a phase/frequency detector, a charge pump, a loop filter, and a voltage controlled oscillator (VCO). The phase/frequency detector compares the phase of a feedback signal and an input signal, and provides an error signal in accordance with the difference. The charge pump receives the error signal and provides a charge signal. The loop filter receives the charge signal and providing a loop filter signal. The bandwidth of the loop filter is increased during a first phase of operation decreased during a second phase of operation.

BRIEF DESCRIPTION OF THE DRAWINGS

The above and other advantages and features of the present invention will be better understood from the following detailed description of the preferred embodiments of the invention, which is provided in connection with the accompanying drawings. The various features of the drawings may not be to scale. Included in the drawing are the following figures.

DETAILED DESCRIPTION

Figure 1:
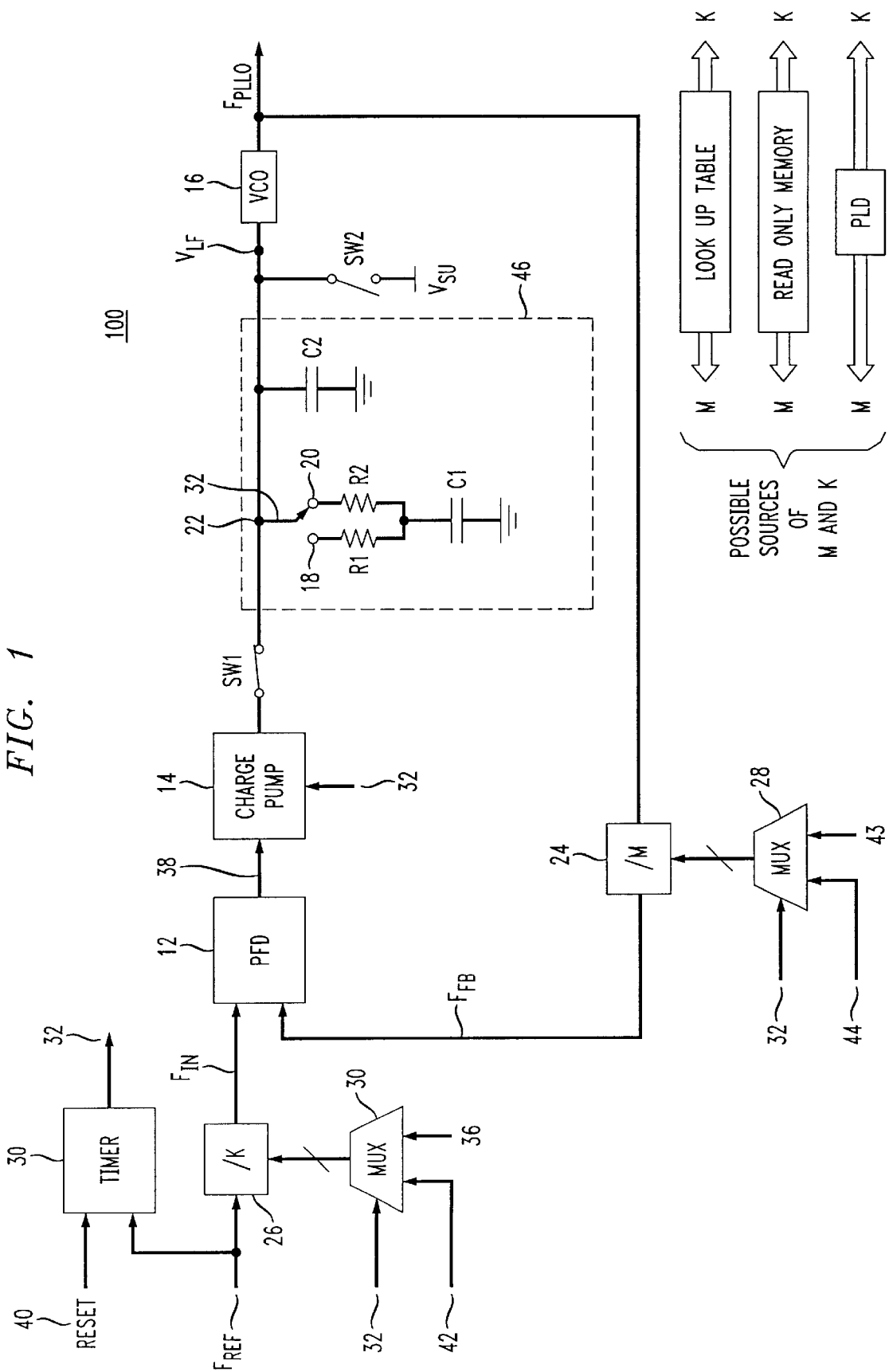
FIG. 1 is a functional block diagram of an exemplary low noise, fast locking circuit comprising a charge-pump phase-lock loop (PLL) in accordance with the present invention.

FIG. 1 is a functional block diagram of an exemplary low noise, fast locking circuit comprising a charge-pump phase-lock loop (PLL) in accordance with the present invention. Phase/frequency detector (PFD) 12 compares the phase of the input signal, $F_{IN}$ to the phase of the feedback signal $F_{FB}$ and generates an error signal 38. The error signal 38 is either an up signal or a down signal. An up signal indicate that the phase of $F_{IN}$ leads the phase of $F_{FB}$. A down signal indicates that the phase of $F_{FB}$ leads the phase of $F_{IN}$. The width of the error signal pulse indicates the magnitude of the phase difference between $F_{IN}$ and $F_{FB}$.

Charge pump 14 generates an amount of charge equivalent (in magnitude and polarity) to the error signal 38 provided by PFD 12. Depending upon the polarity of the error signal 38 (up or down), the charge is either added to or subtracted from the charge developed on capacitors C1 and C2. Capacitors C1 and C2, and resistors R1 and R2 form a loop filter 46. Loop filter 46 operates as an integrator that accumulates the net charge provided by charge pump 14. Loop filter 46 is a low pass filter that essentially removes high frequency noise from the signal provided by charge pump 14.

Figure 2A:
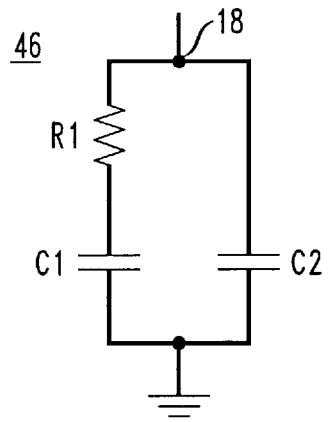
FIG. 2A is an equivalent circuit diagram of an exemplary embodiment of a loop filter in accordance with the present invention.
Figure 2B:
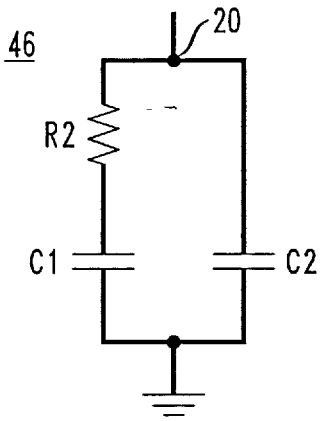
FIG. 2B is an equivalent circuit diagram of another exemplary embodiment of a loop filter in accordance with the present invention.

Switch 22 electrically couples charge pump 14 to one of resistor R1 or resistor R2, via switch positions 18 and 20, respectively. FIGS. 2A and 2B are equivalent circuit diagrams of loop filter 46 wherein switch 22 is configured to electrically couple charge pump 14 to resistor R1 via switch position 18, and wherein switch 22 is configured to electrically couple charge pump 14 to resistor R2 via switch position 20, respectively. The selection of either resistor R1 or R2 affects the bandwidth of loop filter 46. The bandwidth of loop filter 46 affects the performance of PLL circuit 100. As the bandwidth of loop filter 46 is made smaller, the reference clock feedthrough noise of the PLL circuit 100 is decreased (i.e., more high frequency noise is attenuated). However, decreasing the bandwidth of loop filter 46 increases the settling time needed for the PLL circuit 100 to lock onto the input signal, $F_{IN}$. As the resistance (e.g., R1 or R2) of loop filter 46 decreases, the bandwidth of loop filter 46 decreases. Thus, as the resistance of loop filter 46 decreases, the noise performance of PLL circuit 100 tends to improve and the settling time increases. In an exemplary embodiment of the invention, as will be explained in detail, switch 22 is positioned in either switch position 18 or switch position 20 in response to control signal 32, which is provided by timer 30.

The resulting loop filter voltage, $V_{LF}$, is a slowly varying DC signal and is applied to voltage controlled oscillator (VCO) 16. The VCO 16 generates a PLL output signal, $F_{PLLO}$, whose frequency is controlled by $V_{LF}$. A convention used herein denotes a signal by a capital letter "F" with an appropriate subscript, and the frequency of that signal by a lower case "f" with an appropriate subscript. Thus the reference signal, the input signal, the feedback signal, and the PLL output signal, of PLL circuit 100 are denoted $F_{REF}$, $F_{IN}$, $F_{FB}$, and $F_{PLLO}$, respectively. The frequencies of $F_{REF}$, $F_{IN}$, $F_{FB}$, and $F_{PLLO}$, are denoted $f_{REF}$, $f_{IN}$, $f_{FB}$, and $f_{PLLO}$, respectively. The VCO 16 shifts the frequency of $F_{PLLO}$ (i.e., $f_{PLLO}$) so as to minimize the voltage value of $V_{LF}$. $F_{PLLO}$ is used to generate the feedback signal, $F_{FB}$, for the circuit 100. Divide by M feedback divider 24 and divide by K input divider 26 are placed in the feedback and input paths, respectively, to obtain a PLL output signal having a frequency, $f_{PLLO}$, that is either a fraction of or a multiple of the frequency of the reference signal, $f_{REF}$.

The inventors have discovered a circuit (e.g., PLL circuit 100) and a technique for controlling the circuit having the advantages of low jitter associated with integer-N PLL divider circuits and the fast lock time associated with fractional-N PLL divider circuits. The locking of $F_{PLLO}$ with $F_{REF}$ in PLL circuit 100 is controlled in steps or phases (analogous to shifting gears in an automobile transmission).

Figure 3:
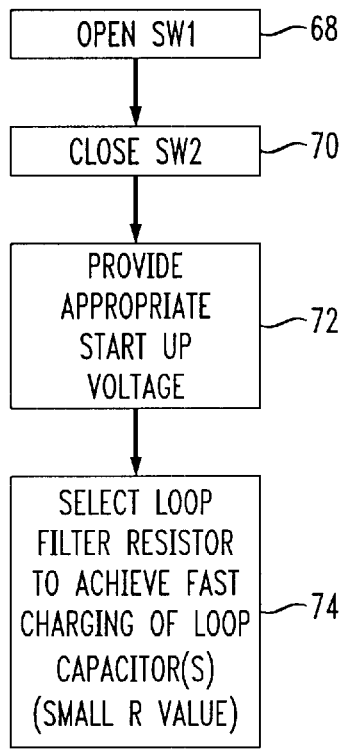
FIG. 3 is a flow diagram of an initial power up phase of an exemplary three-phase gearshifting process in accordance with the present invention.

In an exemplary embodiment of the invention, the "gearshifting" locking process comprises three phases. The three phases comprise an initial power up phase (referred to as phase zero), and first and second phases. Phase zero occurs prior to the other phases. Phase zero occurs during power initially being provided to PLL circuit 100. FIG. 3 is a flow diagram of an initial power up phase of an exemplary three-phase gearshifting process in accordance with the present invention. This initial power up phase is optional. However, a process comprising phase zero may provide a shorter lock time than a process not comprising phase zero. In phase zero, switch SW1 is open and switch SW2 is closed, in accordance with steps 68 and 70, respectively.

Start up voltage, $V_{SU}$, is provided to the VCO 16 through switch SW2 (step 72). The value of the start up voltage, $V_{SU}$, is selected to precharge the large loop capacitor, C2, to an appropriate voltage value to set the VCO 16 to provide the approximate desired frequency of the output PLL signal, $F_{PLLO}$. The start up voltage, $V_{SU}$, value could be, for example, equal to approximately ½ of the supply voltage. In step 74, either R1 or R2 is electrically coupled to the VCO 16. The resistor having the lesser value is selected. Selecting the resistor having the lesser value allows the loop filter 46 to be charged more quickly to the voltage value of $V_{SU}$ than if the resistor having the greater value were selected. The appropriate resistor is selected by positioning switch 22 to either switch position 18 or 20.

Figure 4:
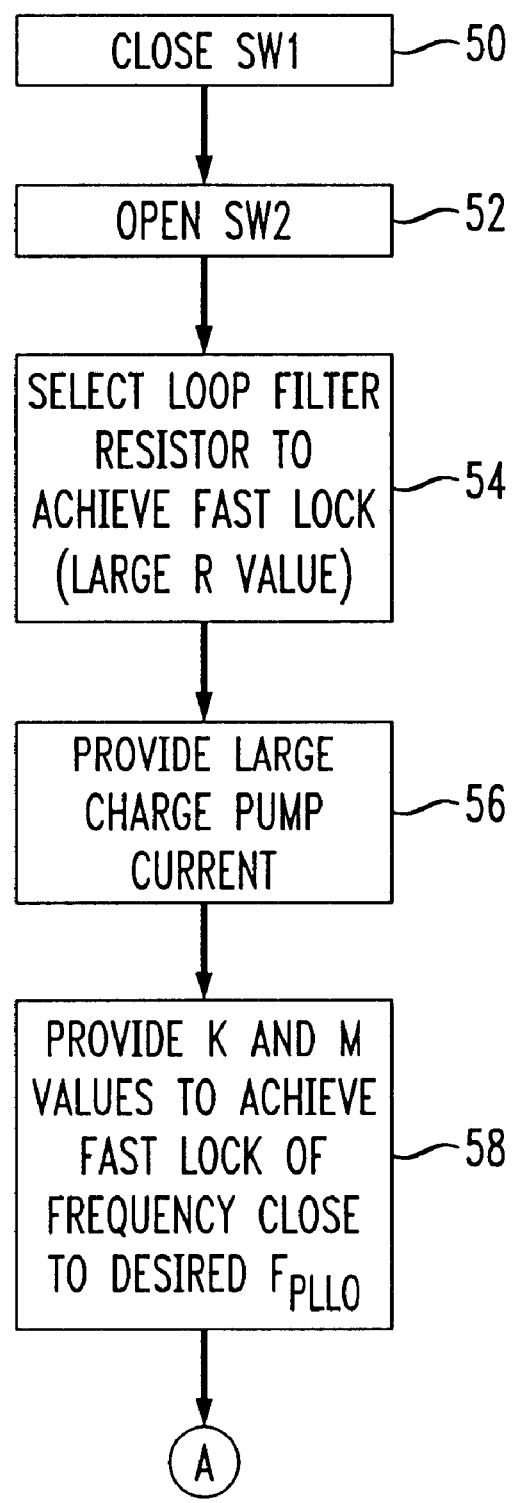
FIG. 4 is a flow diagram of a first phase of an exemplary two-phase gearshifting process in accordance with the present invention.

In another exemplary embodiment of the invention, the gearshifting lock process comprises a pre-lock phase and a lock phase. FIG. 4 is a flow diagram of a first phase of an exemplary two-phase gearshifting process in accordance with the present invention. In the first phase (pre-lock phase), the PLL circuit locks to a frequency approximate to, or equal to, the desired PLL output frequency. The pre-lock phase comprises the characteristic of fast lock time. Then the lock process shifts to a second phase to lock the PLL to the desired frequency, wherein the second phase comprises the characteristics of low jitter and stability.

With reference to FIG. 4 and circuit 100, during the first phase, switch SW1 is closed (step 50) and switch SW2 is opened (step 52). This may be the configuration of switches SW1 and SW2 when power is initially applied to the circuit 100. Alternatively, switches SW1 and SW2 may be set to this configuration from other switch configurations. The circuit 100 is configured to provide fast lock in the first phase. Accordingly, loop filter 46 is configured to provide a large loop filter bandwidth (step 54), charge pump 14 provides a large charge pump current (step 56), and low values of K and M are provided (step 58) to PLL circuit 100.

To achieve the large loop filter bandwidth in the first phase, the loop filter resistor having the larger value of resistance is selected. That is, either R1 or R2 is selected by positioning switch 22 to either switch position 18 or switch position 20, respectively. For example, if the value of R1 is less than the value of R2, switch 22 is positioned to switch position 20 to select resistor R2 in the first phase. Alternatively, if the value of R2 is less than the value of R1, switch 22 is positioned to switch position 18 to select resistor R1 in the first phase. Although, FIG. 1 depicts two discrete resistors, R1 and R2, in loop filter 46, other resistor configurations are envisioned, such as more than two resistors, a variable resistor, and semiconductor resistors.

It is well known in the art that a large charge pump current provides fast locking capability. Thus, to force PLL circuit 100 to lock more quickly during the first phase, a large charge pump current is provided using well known conventional techniques. Controlling PLL circuit 100 in accordance with the present invention does not require modification of the charge pump 14 current. However, appropriately modifying the charge pump 14 current enhances the locking performance of PLL circuit 100. In an alternate embodiment of the invention, charge pump 14 is configured to provide a large charge pump current in the first phase, by means which are well know in the art. The amount of charge current provided is the amount appropriate to achieve the desired lock time.

In the first phase, appropriate values of K and M are provided to PLL circuit 100 to achieve fast lock of a frequency that is approximate to the desired $f_{PLLO}$. All other parameters remaining constant, the smaller the values of K and M, the more quickly lock may be achieved. Accordingly, the values of K and M, provided to PLL circuit 100 in the first phase, are as small as practicable to make the $f_{PLLO}$ as close to the desired frequency as possible and achieve the desired lock time. Values of K and M are provided to dividers 26 and 24 by multiplexers 30 and 28, respectively. Signal 42 provides the values of K for the first phase to multiplexer 30. Signal 44 provides the values of M for the first phase to multiplexer 28. In an alternate embodiment of the invention, control signal 32 selects one of signal 42 or signal 36 for multiplexer 30, and selects one of signal 44 or signal 43 for multiplexer 28. Values of K and M may be provided to multiplexers 30 and 28, respectively, by any appropriate means, such as a look up table, a read only memory, a programmable logic device (PLD), etc. Thus, PLL circuit 100 is configured to achieve fast lock of a frequency approximate to the desired output frequency, $f_{PLLO}$. Control of PLL circuit 100 then transitions to the second phase.

Figure 5:
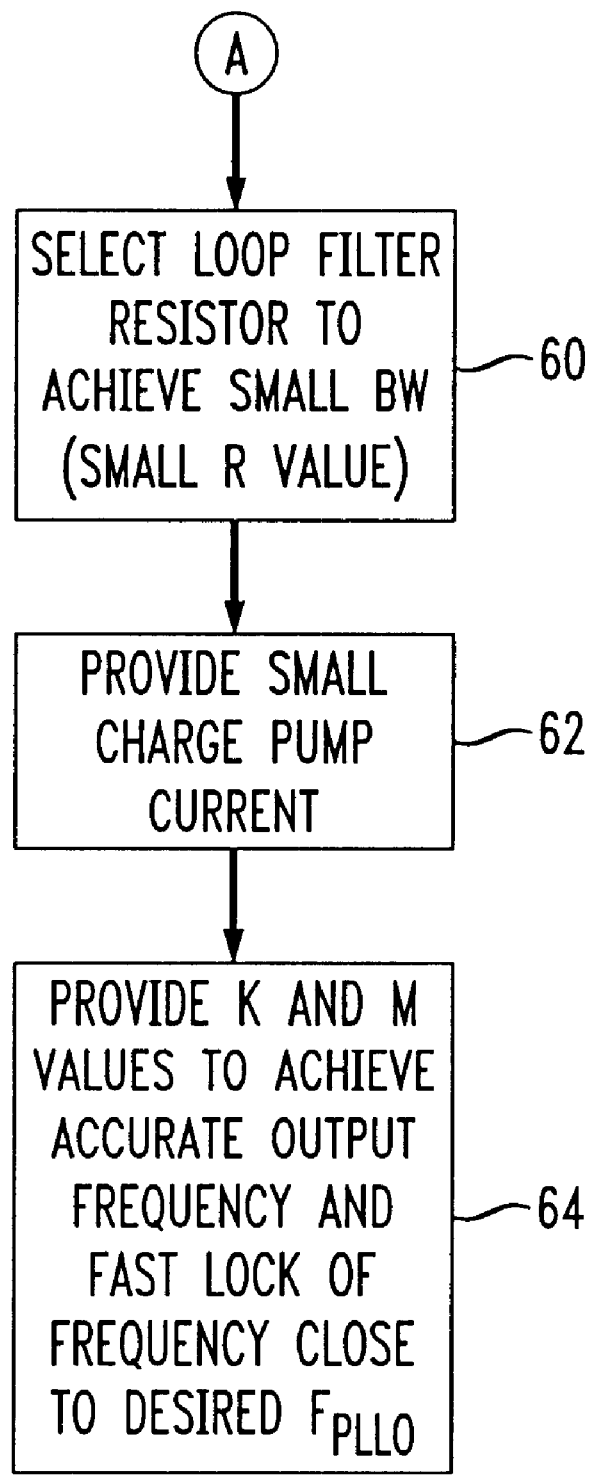
FIG. 5 is a flow diagram of a second phase of an exemplary two-phase gearshifting process in accordance with the present invention.

FIG. 5 is a flow diagram of a second phase of an exemplary two-phase gearshifting process in accordance with the present invention. In the second phase, the PLL circuit 100 locks to the desired output frequency, $f_{PLLO}$. Also, in the second phase, PLL circuit 100 is configured to provide low noise and loop stability. Because PLL circuit 100 is locked to an output frequency approximate to the desired output frequency in the first phase, PLL circuit 100 locks to the desired output frequency relatively quickly in the second phase. That is, because the frequency error is small, the PLL circuit 100 is able to lock to the desired output frequency in a relatively short time even with a relatively narrow loop bandwidth. In the second phase, loop filter 46 is configured to provide a small loop filter bandwidth (step 60), optionally, charge pump 14 provides a small charge pump current (step 62), and appropriate values of K and M are provided (step 64) to PLL circuit 100.

To achieve a relatively small loop filter bandwidth in the second phase, the loop filter resistor having the smaller value of resistance is selected. That is, either R1 or R2 is selected by positioning switch 22 to either switch position 18 or switch position 20, respectively. For example, if the value of R1 is less than the value of R2, switch 22 is positioned to switch position 18 to select resistor R1 in the second phase. Alternatively, if the value of R2 is less than the value of R1, switch 22 is positioned to switch position 20 to select resistor R2 in the second phase. Although, FIG. 1 depicts two discrete resistors, R1 and R2, in loop filter 46, other resistor configurations are envisioned, such as more than two resistors, a variable resistor, and semiconductor resistors. Loop filter 46 is exemplary, other types of loop filters may be implemented (e.g., higher order Butterworth filters, Chebyshev filters). Regardless of the type of loop filter implemented, the loop bandwidth is adjusted such that the loop bandwidth during the first phase is greater than the loop bandwidth during the second phase.

As previously mentioned, controlling PLL circuit 100 in accordance with the present invention does not require modification of the charge pump 14 current. However, appropriately modifying the charge pump 14 current enhances the locking performance of PLL circuit 100. In an alternate embodiment of the invention, charge pump 14 is configured to provide a small charge pump current in the second phase, by means which are well know in the art. The amount of charge current provided is the amount appropriate to achieve the desired loop stability.

In the second phase, appropriate values of K and M are provided to PLL circuit 100 to achieve low jitter and stable lock of the desired PLL output frequency. Signal 36 provides the values of K for the second phase to multiplexer 30. Signal 43 provides the values of M for the second phase to multiplexer 28. In an alternate embodiment of the invention, control signal 32 selects one of signal 42 or signal 36 for multiplexer 30, and selects one of signal 44 or signal 43 for multiplexer 28. Values of K and M may be provided to multiplexers 30 and 28, respectively, by any appropriate means, such as a look up table, a read only memory, a programmable logic device (PLD), etc. Accordingly, the values of K and M, provided to PLL circuit 100 in the second phase, are determined by the desired output frequency and the reference frequency.

In an alternate embodiment of the invention, a timer circuit 30 provides a control signal 32 to control switch 22, charge pump 14, and multiplexers 28 and 30. Accordingly, control signal 32 positions switch 22 to one of switch position 18 or switch position 20 dependent upon the phase of the gearshifting control. Control signal 32 also selects signal 44 to be provided to divider 24 by multiplexer 28 and selects signal 42 to be provided to divider 26 by multiplexer 30, in the first phase. Control signal 32 also selects signal 43 to be provided to divider 24 by multiplexer 28 and selects signal 36 to be provided to divider 26 by multiplexer 30, in the second phase. Control signal 32 may also control charge pump 14 to provide a relatively large charge pump current in the first phase and provide a relatively small charge pump current in the second phase.

In an exemplary embodiment of the invention, upon power being initially supplied to PLL circuit 100, reset signal 40 starts timer 30. Timer 30 is configured such that the state of control signal 32 will change in a predetermined amount of time after receipt of reset signal 40. The predetermined amount of time corresponds to the amount of time that PLL circuit 100 remains in the first phase before transitioning to the second phase. During the first phase (prior to control signal 32 changing state) a relatively small charge pump current is provided by charge pump 14, the smaller of R1 and R2 is selected by switch 22, signal 42 is provided to divider 26 by multiplexer 30, and signal 44 is provided to divider 24 by multiplexer 28. Upon control signal 32 changing state, switch 22 is repositioned select the other of resistor R1 or R2, charge pump 14 provides a relatively large charge pump current, signal 36 is provided to divider 26 by multiplexer 30, and signal 43 is provided to divider 24 by multiplexer 28.

In an alternate embodiment of the invention, switch SW2 is controlled by control signal 32. If control signal 32 is provided by timer 30, then control signal 32 comprises three states. The first state of control signal 32 opens switch SW1 and closes switch SW2. The second and third states of control signal 32 control the PLL circuit as described herein for the first and second gearshifting control phases. Switches SW1 and SW2 may also be controlled by means other than control signal 32. Examples include a sensing circuit or device that senses the voltage, the current, or rate of change of voltage or current (e.g., dv/dt or di/dt) developed across or through capacitor C2.

Figure 6:
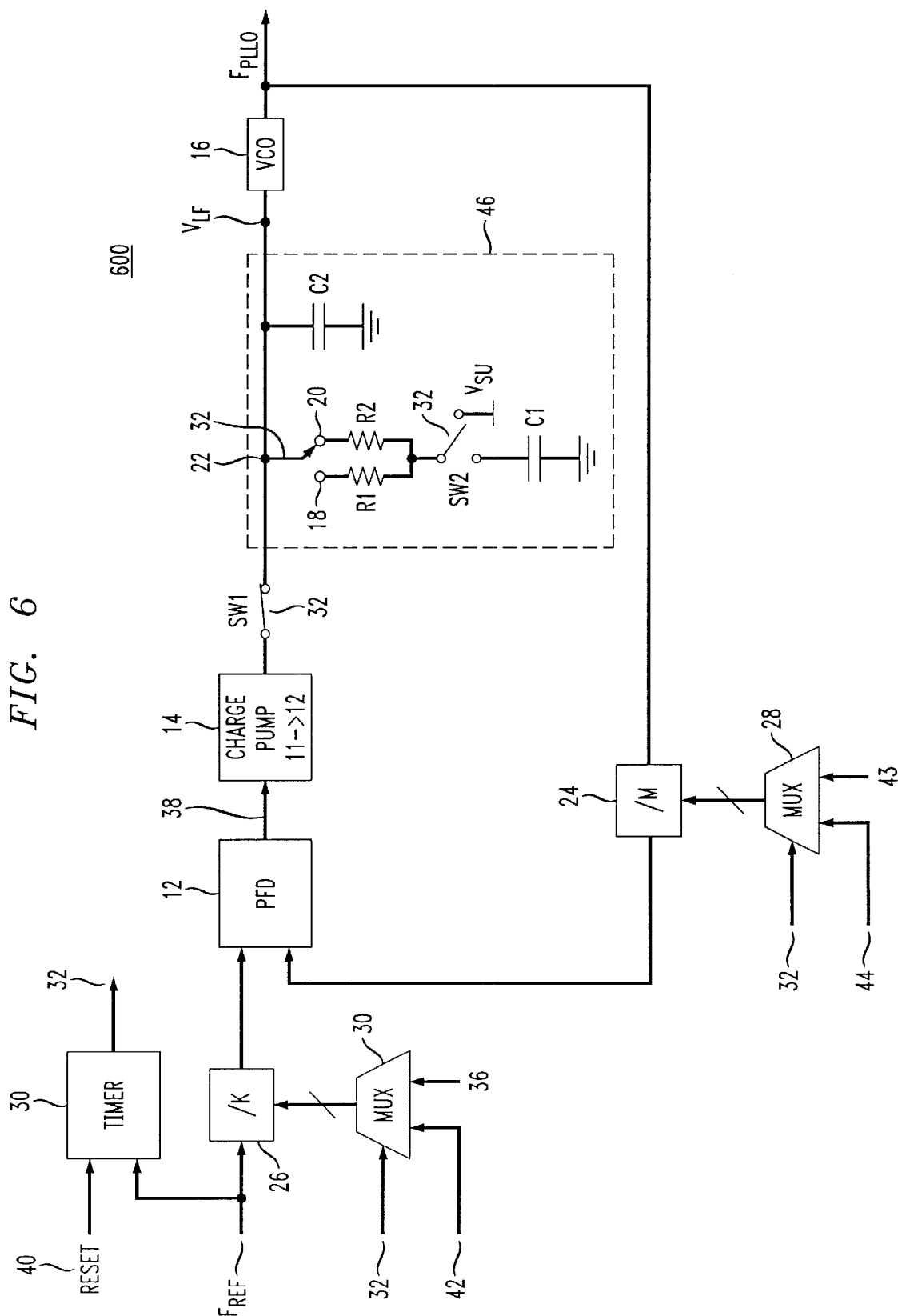
FIG. 6 is a block diagram of another exemplary embodiment of a PLL circuit in accordance with the present invention.

FIG. 6 is block diagram of another exemplary embodiment of a PLL circuit 600 in accordance with the present invention. In the PLL circuit 600, switch SW2 is incorporated as part of loop filter 46. Gearshifting control of PLL circuit 600 is the similar to gearshifting control for the PLL circuit 100 as described herein. The difference being that switch SW2 being closed in PLL circuit 100 is analogous to switch SW2 being coupled to start up voltage, $V_{SU}$, in PLL circuit 600, and switch SW2 being open in PLL circuit 100 is analogous to switch SW2 being coupled to start up capacitor C1 in PLL circuit 600.

In an exemplary embodiment of the invention, PLL circuit 100 is utilized in a wireless Bluetooth™ system. Bluetooth™ is a specification for short-range radio links between mobile computers, mobile phones, digital cameras, and other portable devices (see http://www.bluetooth.com). A Bluetooth™ system incorporates a baseband frequency synthesizer to generate either a 12 or 13 MHz clock signal. The Bluetooth™ system receives one of the seven specified reference frequencies and generates the 12 or 13 MHz clock signal in accordance with one of the reference signals. The seven reference frequencies are: 12.8 MHz, 15.36 MHz, 16.8 MHz, 19.2 MHz, 19.44 MHz, 19.68 MHz, and 19.8 MHz. These seven reference frequencies have a common denominator of 40 kHz, thus allowing the 12 and 13 MHz clock signal to be generated by a PLL circuit having an integer-N divider circuit. However, the Bluetooth™ specification also has a 250 μs lock time requirement. Thus, the narrow loop bandwidth required for a 40 kHz reference frequency would have a negative impact on locking time.

Divide by M feedback divider 24 and divide by K input divider 26 are placed in the feedback and input paths, respectively, to obtain an output signal having a frequency, $f_{PLLO}$, that is either a fraction of or a multiple of the frequency of the reference signal, $f_{REF}$. During lock, $$f_{IN} = f_{FB}. \quad (1)$$

Also, as shown in FIG. 1, $$f_{IN} = f_{REF}/K, \text{ and} \quad (2)$$

$$f_{FB} = f_{PLLO}/M. \quad (3)$$

Combining equations (2) and (3), and solving for $f_{PLLO}$, results in:

$$f_{PLLO} = \frac{M}{K} f_{REF}, \quad (4)$$

where M and K are the feedback divider and input divider ratios, respectively.

Table 1 shows the values of K and M used to generate the Bluetoothυ clock frequencies utilizing PLL circuit 100 in the first phase of a two-phase gearshifting process in accordance with the present invention. The first column, starting from the left, represents the Bluetooth™ reference frequencies. The column headed $f_{PLLO}$ represents the intermediate frequency that PLL circuit 100 locks to during the first phase for each Bluetooth™ reference frequency. The column headed Δf represents the difference in the desired frequency and the intermediate frequency for each Bluetooth™ reference frequency. Table 2 shows the values of K and M used to generate the Bluetooth™ clock frequencies utilizing PLL circuit 100 in the second phase of a two-phase gearshifting process in accordance with the present invention.

TABLE 1

| Ref. Freqs | $f_{PLLO}$ = 12 MHz | | | | $f_{PLLO}$ = 13 MHz | | | |
|---|---|---|---|---|---|---|---|---|
| (MHz) | K | M | $f_{PLLO}$ (MHz) | Δf (MHz) | K | M | $f_{PLLO}$ (MHz) | Δf (MHz) |
| 12.8 | 1 | 1 | 12.8 | 0.80 | 1 | 1 | 12.8 | −0.20 |
| 15.36 | 4 | 3 | 11.52 | −0.48 | 6 | 5 | 13.16 | 0.16 |

TABLE 1-continued

| Ref. Freqs | $f_{PLLO}$ = 12 MHz | | | | $f_{PLLO}$ = 13 MHz | | | |
|---|---|---|---|---|---|---|---|---|
| (MHz) | K | M | $f_{PLLO}$ (MHz) | Δf (MHz) | K | M | $f_{PLLO}$ (MHz) | Δf (MHz) |
| 16.8 | 4 | 3 | 12.6 | 0.60 | 4 | 3 | 12.6 | −0.40 |
| 19.2 | 3 | 2 | 12.8 | 0.80 | 3 | 2 | 12.8 | −0.20 |
| 19.44 | 5 | 3 | 11.66 | −0.34 | 3 | 2 | 12.96 | −0.04 |
| 19.68 | 5 | 3 | 11.8 | −0.20 | 3 | 2 | 13.12 | 0.12 |
| 19.80 | 5 | 3 | 11.88 | −0.12 | 3 | 2 | 13.2 | 0.20 |

TABLE 2

| Ref. Freqs | $f_{PLLO}$ = 12 MHz | | $f_{PLLO}$ = 13 MHz | |
|---|---|---|---|---|
| (MHz) | K | M | K | M |
| 12.80 | 16 | 15 | 64 | 65 |
| 15.36 | 96 | 75 | 384 | 325 |
| 16.8 | 21 | 15 | 84 | 65 |
| 19.2 | 8 | 5 | 96 | 65 |
| 19.44 | 81 | 50 | 486 | 325 |
| 19.68 | 41 | 25 | 492 | 325 |
| 19.80 | 33 | 20 | 99 | 65 |

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for controlling a phase-lock loop (PLL) circuit for providing an output signal having a desired output frequency, said PLL circuit comprising a loop filter providing a first loop bandwidth, said PLL circuit receiving a reference signal having a reference frequency, said method comprising the steps of:

(a) achieving lock between said reference signal and said output signal with said PLL circuit, said PLL circuit operating within constraints of said first loop bandwidth, wherein said PLL circuit comprises fractional-N division;

(b) providing a second loop bandwidth, wherein said second loop bandwidth is more narrow than said first loop bandwidth;

(c) providing integer-N division to said PLL circuit; and (d) achieving lock between said reference signal and said output signal with said PLL circuit, said PLL circuit operating within constraints of said second loop bandwidth.

2. A method in accordance with claim 1, wherein:

step (a) comprises achieving lock between said reference signal and said output signal having a frequency approximately equal to said desired output frequency; and step (d) comprises achieving lock between said reference signal and said output signal having a frequency equal to said desired output frequency.

3. A method in accordance with claim 1, said loop filter comprising a selectable first loop filter resistance and a selectable second loop filter resistance, said first loop filter resistance being greater than said second loop filter resistance, wherein said first loop filter resistance is selected in step (a) and said second loop filter resistance is selected in step (d).

4. A method in accordance with claim 1, further comprising the step of configuring said PLL circuit to provide an output signal having a constant output frequency prior to step (a).

5. A method in accordance with claim 1, said PLL circuit comprising a charge pump providing one of a selectable first charge pump current and a selectable second charge pump current, said first charge pump current being greater than said second charge pump current, wherein said charge pump provides said first charge pump current in step (a) and said charge pump provides said second charge pump current in step (d).

6. A phase-lock loop (PLL) circuit comprising:
   a phase detector for comparing the phase of a feedback signal and an input signal, and for providing an error signal in response to a difference in phase between said input signal and said feedback signal;
   a charge pump for receiving said error signal and providing a charge signal;
   a loop filter for receiving said charge signal and for providing a loop filter signal, said loop filter providing one of a first loop filter bandwidth and a second loop filter bandwidth, said second loop filter bandwidth being more narrow than said first loop filter bandwidth, wherein said loop filter provides said first loop filter bandwidth during a first phase of operation of said PLL circuit, and said loop filter provides said second loop filter bandwidth during a second phase of operation of said PLL circuit;
   a voltage controlled oscillator (VCO) for receiving said loop filter signal and providing an output signal, wherein said output signal is coupled to said phase detector;
   a feedback divider for receiving said output signal and dividing said output signal to provide said feedback signal, wherein said output signal is divided by a first feedback divider value in said first phase of operation and said output signal is divided by a second feedback divider value in said second phase of operation;
   an input divider for receiving a reference signal and dividing said reference signal to provide said input signal, wherein said reference signal is divided by a first input divider value in said first phase of operation and said reference signal is divided by a second input divider value in said second phase of operation; and
   at least one of a look up table, a read only memory, and a programmable logic device for providing said input and feedback divider values, wherein:
      lock is achieved via fractional-N division during said first phase, and
      lock is achieved via integer-N division during said second phase.

7. A PLL circuit in accordance with claim 6, wherein said PLL circuit is an integrated circuit.

8. A PLL circuit in accordance with claim 6, wherein said loop filter comprises a selectable first loop filter resistance and a selectable second loop filter resistance, said first loop filter resistance being greater than said second loop filter resistance, wherein said first loop filter resistance is selected for said first phase of operation and said second loop filter resistance is selected for said second phase of operation.

9. A PLL circuit in accordance with claim 6 further comprising:
   a feedback multiplexer for providing one of said first feedback divider value in said first phase of operation and said second feedback divider value in said second phase of operation; and
   an input multiplexer for providing one of said first input divider value in said first phase of operation and said second input divider value in said second phase of operation.

10. A PLL circuit in accordance with claim 9, further comprising a timer for providing a control signal to said feedback multiplexer and said input multiplexer for providing selection control of said feedback multiplexer and said input multiplexer.

11. A PLL circuit in accordance with claim 8, further comprising a timer for providing a control signal to said loop filter for selecting one of said selectable first loop filter resistance and said selectable second loop filter resistance.

12. A PLL circuit in accordance with claim 6 further comprising:
   a first switching means for coupling said charge pump to said loop filter; and
   a second switching means for coupling said loop filter and said VCO to a start up voltage, wherein:
      during a power up phase, said first switching means provides an open circuit and said second switching means provides a closed circuit; and
      during said first and second phases of operation, said first switching means provides a closed circuit and said second switching means provides an open circuit.

13. A PLL circuit in accordance with claim 6 further comprising:
   a first switching means for coupling said charge pump to said loop filter; and
   a second switching means for coupling a loop filter resistance to one of a grounded capacitor and a start up voltage, wherein:
      during a power up phase, said first switching means provides an open circuit and said second switching means couples said loop resistance to said start up voltage; and
      during said first and second phases of operation, said first switching means provides a closed circuit and said second switching means couples said loop resistance to said grounded capacitor.

14. A PLL circuit in accordance with claim 6, said charge pump providing one of a selectable first charge pump current and a selectable second charge pump current, said first charge pump current being greater than said second charge pump current, wherein said charge pump provides said first charge pump current during said first phase of operation and said charge pump provides said second charge pump current during said second phase of operation.

15. A PLL in accordance with claim 6, wherein:
   said output signal has an output frequency comprising one of 12 MHz and 13 MHz; and
   said input signal has an input frequency comprising one of 12.8 MHz, 15.36 MHz, 16.8 MHz, 19.2 MHz, 19.44 MHz, 19.68 MHz, and 19.80 MHz.

* * * * *